(12) United States Patent
Gardner et al.

(10) Patent No.: US 6,268,637 B1
(45) Date of Patent: Jul. 31, 2001

(54) METHOD OF MAKING AIR GAP ISOLATION BY MAKING A LATERAL EPI BRIDGE FOR LOW K ISOLATION ADVANCED CMOS FABRICATION

(75) Inventors: Mark I. Gardner, Cedar Creek; Frederick N. Hause; Charles E. May, both of Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/178,080

(22) Filed: Oct. 22, 1998

(51) Int. Cl.[7] .................................................. H01L 29/00
(52) U.S. Cl. ........................... 257/522; 257/510; 438/422
(58) Field of Search ................................. 257/522, 510, 257/900; 438/422

(56) References Cited

U.S. PATENT DOCUMENTS

| | | | |
|---|---|---|---|
| 4,106,050 | * 8/1978 | Riseman | 257/522 |
| 4,638,552 | * 1/1987 | Shimbo et al. | 257/522 |
| 5,510,645 | * 4/1996 | Fitch et al. | 257/522 |
| 5,926,721 | * 7/1999 | Hong et al. | 438/422 |

OTHER PUBLICATIONS

Stanley Wolf and Richard N. Tauber; *Silicon Processing for the VLSI Era, Volume 1—Process Technology*; pp. 124–135; 1986.

* cited by examiner

*Primary Examiner*—Mark V. Prenty
(74) *Attorney, Agent, or Firm*—Timothy M. Honeycutt

(57) ABSTRACT

An isolation structure and a method of making the same are provided. In one aspect, the method includes the steps of forming a trench in a substrate and forming a first insulating sidewall in the trench and a second insulating in the trench in spaced-apart relation to the first insulating sidewall. A bridge layer is formed between the first and the second sidewalls. The bridge layer, the first and second sidewalls, and the substrate define an air gap in the trench. The isolation structure exhibits a low capacitance in a narrow structure. Scaling is enhanced and the potential for parasitic leakage current due to non-planarity is reduced.

21 Claims, 4 Drawing Sheets

METHOD OF MAKING AIR GAP ISOLATION BY MAKING A LATERAL EPI BRIDGE FOR LOW K ISOLATION ADVANCED CMOS FABRICATION

BACKGROUND OF THE INVENTION

1. Field of the Invention

This invention relates generally to semiconductor processing, and more particularly to an isolation structure and to a method of making the same incorporating an air gap.

2. Description of the Related Art

The implementation of integrated circuits involves connecting isolated circuit devices through specific electrical pathways. Where integrated circuits are implemented in silicon, it is necessary, therefore, to initially isolate the various circuit devices built into the silicon substrate from one another. The circuit devices are thereafter interconnected to create specific circuit configurations through the use of global interconnect or metallization layers and local interconnect layers.

Local oxidation of silicon ("LOCOS") and trench and refill isolation represent two heavily used isolation techniques for both bipolar and metal oxide semiconductor ("MOS") circuits. In a conventional semi-recessed LOCOS process, a thin pad oxide layer is thermally grown on a silicon substrate surface and coated with a layer of chemical vapor deposition ("CVD") silicon nitride. The active regions of the substrate are then defined with a photolithographic step. The nitride layer is then dry etched and the pad oxide layer wet or dry etched with the photoresist left in place to serve as a masking layer for a subsequent channel stop implant. After the channel stop implant, field oxide regions are thermally grown by means of a wet oxidation step. The oxidation of the silicon proceeds both vertically into the substrate and laterally under the edges of the nitride layer, resulting in the formation of structures commonly known as bird's beaks.

The formation of bird's beak structures is problematic in a number of ways. To begin with, bird's beak formation can create significant limitations on the packing density of devices in an integrated circuit. Design rules for LOCOS processes must restrict the gaps between adjacent devices to account for the lateral encroachment of bird's beaks. In addition, the very shape of a bird's beak can result in the exposure of the substrate surface during subsequent overetching to open contacts for metallization. This can result in the source of the transistor becoming shorted to the well region when the metal interconnect film is deposited. This problem may be particularly acute in CMOS circuits where shallower junctions are used, due to the higher propensity for the exposure of the well regions. While some improvement in the formation of bird's beak structures has occurred as a result of the introduction of techniques such as the etchback of portions of the field oxide structures, deposition of a silicon nitride layer without a pad oxide layer, and use of a thin pad oxide covered with polysilicon, the difficulties associated with bird's beak formation have not been completely eliminated.

In trench based isolation structures, a damascene process is used to pattern and etch a plurality of trenches in the silicon substrate. The trenches are then refilled with a CVD silicon dioxide or doped glass layer that is planarized back to the substrate surface using etchback planarization or chemical mechanical polishing ("CMP"). Although conventional trench and refill isolation techniques eliminate the difficulties associated with bird's beak formation in LOCOS processes, there are nevertheless difficulties associated with the trench and refill isolation techniques. Some of these difficulties include the inversion of the silicon at the sidewalls of p-type active regions which can lead to latch-up conditions in CMOS circuits, and the development of sidewall and edge-parasitic conduction stemming from a lack of planarity between the trench isolation material and the active areas.

The problem of sidewall inversion is caused by the horizontal parasitic MOS device, with the well acting as the gate electrode and the trench dielectric acting as the MOS gate oxide. The voltage across this parasitic device will normally be the nominal operating voltage of the device, e.g., 3.3 or 5 volts. This gate voltage and the narrow trench width can cause inversion along the sidewall, outside of, but facing the well. At the onset of sidewall inversion, n-channel devices with source/drain regions butted to the same sidewall can become electrically connected by a path along the sidewall.

Another other potential drawback of trench and reflow isolation processing is the requirement for a very high degree of planarization of the trench dielectric and the substrate surface. To ensure that the CVD silicon dioxide trench isolation material is removed from all of the active areas at the conclusion of a typical etchback step, an overetch of the trench isolation material of at least 200 to 500 Å is performed. The trench isolation material is thus etched below the active area surface, exposing a portion of the active area sidewall. This exposed sidewall can lead to sidewall and edge parasitic conduction which can result in significant leakage currents and correspondingly poor device performance. CMP planarization can typically yield more highly planarized trench isolation dielectric and substrate surfaces. However, there remains the potential for small differentials in the upper surfaces of the substrate and the trench isolation dielectric at the interface between the two structures due primarily to differential polish rates during the CMP process.

The present invention is directed to overcoming or reducing the effects of one or more of the foregoing disadvantages.

SUMMARY OF THE INVENTION

In accordance with one aspect of the present invention, an isolation structure positioned in a trench in a substrate is provided. The isolation structure includes a first insulating sidewall and a second insulating sidewall positioned in spaced-apart relation to the first insulating sidewall. A bridge layer is coupled to the first and second insulating sidewalls. The bridge layer, the first and second insulating layers and the substrate define an air gap in the trench.

In accordance with another aspect of the present invention, an integrated circuit is provided that includes a substrate that has a trench. A first circuit device is positioned on the substrate and a second circuit device is positioned on the substrate. An isolation structure is positioned in the trench and separates the first and second circuit devices. The isolation structure has a first insulating sidewall, a second insulating sidewall positioned in spaced-apart relation to the first insulating sidewall, and a bridge layer coupled to the first and second insulating sidewalls. The bridge layer, the first and second insulating layers and the substrate define an air gap in the trench.

In accordance with another aspect of the present invention, a method of fabricating an electrical isolation structure in a substrate is provided that includes the steps of forming a trench in the substrate and forming a first insulating sidewall in the trench and a second insulating in the trench in spaced-apart relation to the first insulating sidewall. A bridge layer is formed between the first and the second sidewalls. The bridge layer, the first and second sidewalls, and substrate define an air gap in the trench.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
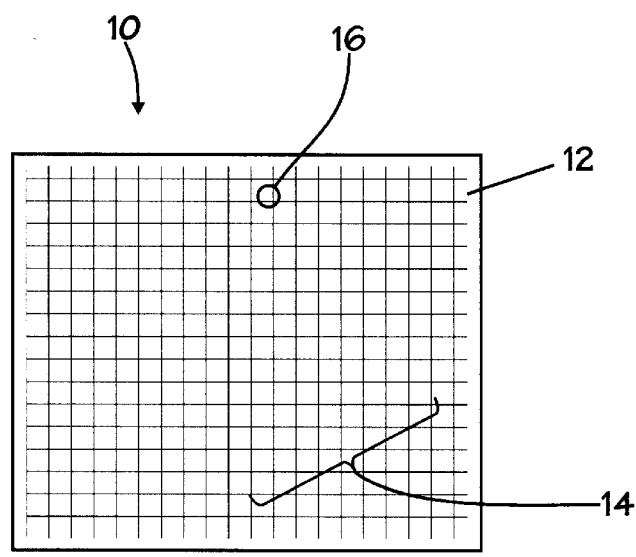
FIG. 1 is a plan view of an exemplary embodiment of an integrated circuit in accordance with the present invention.

In the drawings described below, reference numerals are generally repeated where identical elements appear in more than one figure. Turning now to the drawings, and in particular to FIG. 1, there is shown a plan view of an exemplary embodiment of an integrated circuit 10 implemented on a semiconductor substrate 12. The substrate 12 may be n-doped silicon, p-doped silicon, silicon-on-insulator or other suitable substrate material. The integrated circuit 10 includes a plurality of circuit devices 14 that can include transistors, capacitors, resistors or the like. A very small portion of the integrated circuit 10 is designated 16 and is shown in a highly magnified plan view in FIG. 2. Various metallization and interlevel dielectric layers have been peeled away in FIG. 2 to reveal two exemplary circuit devices 18 and 20 that are formed on respective active areas 22 and 24 of the substrate 12. As used herein, the terms "formed on" or "disposed on" should be construed to include the possibility that a given structure or layer may be formed on another given layer with a third or other intervening layers disposed between the two. For the purpose of illustration, the circuit devices 18 and 20 are depicted as field effect transistors. However, as noted above, the circuit devices 18 and 20 may be implemented as a variety of different types of electronic devices.

Figure 2:
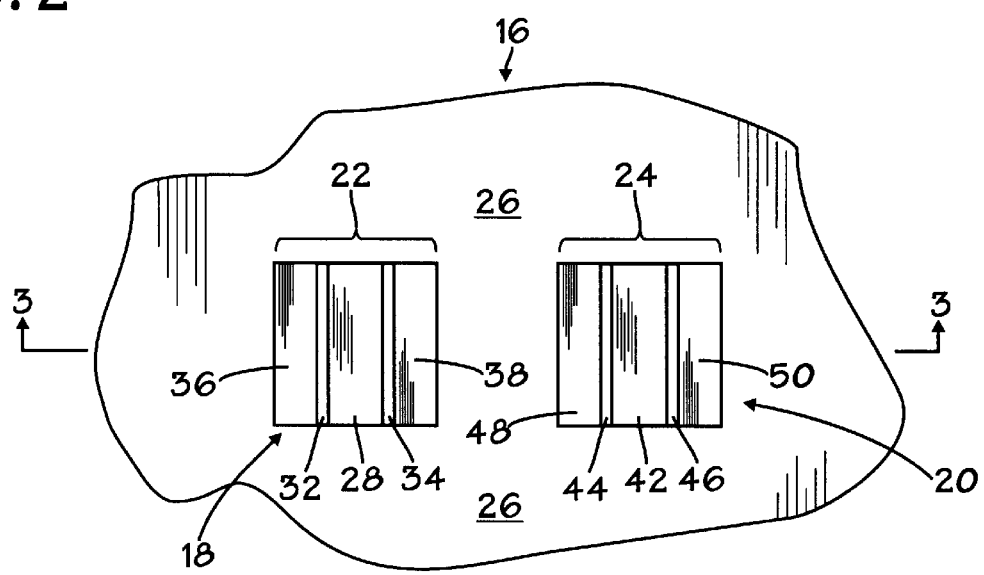
FIG. 2 is a highly magnified plan view of a small portion of the integrated circuit of FIG. 1 in accordance with the present invention.
Figure 3:
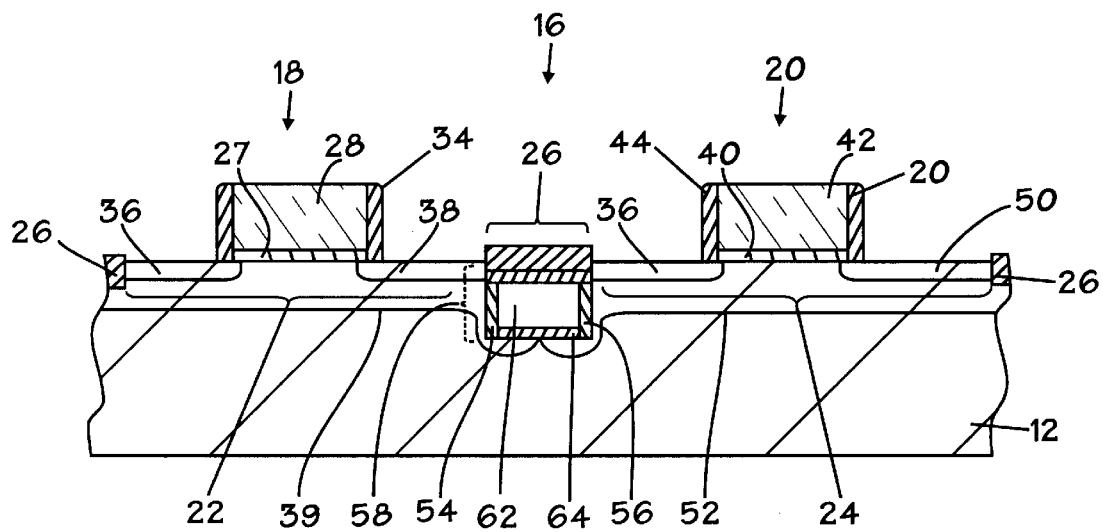
FIG. 3 is a cross sectional view of FIG. 2 taken at section 3—3.

Referring now also to FIG. 3, which is a cross sectional view of FIG. 2 taken at section 3—3, the active areas 22 and 24 are surrounded by an isolation structure 26. The isolation structure 26 is a moat-like structure fabricated to provide initial electrical isolation for the circuit devices 18 and 20 and other devices of the circuit 10. Metallization and local interconnect patterning are used to interconnect the devices 18 and 20 together or with other devices in the circuit 10.

The detailed structure of the transistors 18 and 20 may be understood by referring now to FIG. 2 and FIG. 3. The transistor 18 includes a gate dielectric layer 27 positioned on the substrate 12 and a gate electrode 28 positioned on the gate dielectric layer 27. The gate dielectric layer 27 and the gate electrode 28 are bracketed by a pair of dielectric sidewall spacers 32 and 34. Source/drain regions 36 and 38 are formed and separated laterally in the substrate 12. The phrase "source/drain region(s)" is used herein to describe a region that may serve as either a source or a drain. The skilled artisan will appreciate that a source/drain region may function as a source or a drain depending upon how it is interconnected during metallization. The transistor 18 is positioned over a well 39 established in the substrate 12 by appropriate doping. The transistor 20 is provided with a gate dielectric layer 40 positioned on the substrate 12 and a gate electrode 42 positioned on the gate dielectric layer 40. Like the transistor 18, the transistor 20 also includes opposing dielectric sidewall spacers 44 and 46 and laterally separated source/drain regions 48 and 50. The transistor 20 is similarly positioned over a well 52 established in the substrate 12 by appropriate doping. The wells 39 and 52 may be twin, twin retrograde or other type of well and may be n-wells, or p wells, or of opposite conductivity type in the event the transistors 18 and 20 are implemented as twin-well CMOS.

The detailed structure of the isolation structure 26 may be understood by referring to FIGS. 2 and 3. The isolation structure 26 may be implemented as a moat-like structure that is globally established on the substrate 12 as shown in FIGS. 2 and 3, or as a more locally implemented isolation structure as desired. For simplicity of illustration, only that portion of the isolation structure 26 positioned between the active areas 22 and 24 will be described. However, the skilled artisan will appreciate that the description of the portion between the active areas 22 and 24 will be illustrative of other portions of the isolation structure 26. The isolation structure 26 includes insulating sidewalls 54 and 56 positioned in spaced-apart relation in a trench 58 formed in the substrate 12. An insulating bridge layer 60 is formed generally between the insulating sidewalls 54 and 56, spanning the width of the trench 58. The bridge layer 60, the insulating sidewalls 54 and 56 and the substrate 12 define an air gap 62 in the trench 58. A bottom layer 64 is positioned in the bottom 65 of the trench 58. The bottom layer 64 is not a necessary component of the isolation structure 26, but is merely a byproduct of the process used to fabricate the bridge layer 60. An insulating or screen layer 66 is positioned on the bridge layer 60 to function principally as an implant screen so that various ion implants do not render the bridge layer 60 conductive.

Figure 4:
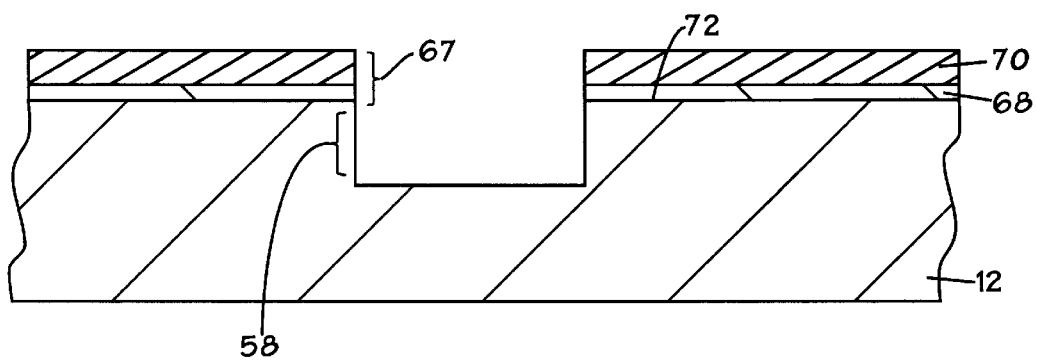
FIG. 4 is a cross sectional view of a semiconductor substrate depicting formation of an isolation trench in accordance with the present invention.

An exemplary process flow for fabricating the isolation structure 26 in accordance with the present invention may be understood by referring now to FIGS. 4, 5, 6, 7, 8 and 9, and initially to FIG. 4. A protective stack 67 is formed on the substrate 12. The stack 67 is designed to protect the substrate 12 during subsequent processing steps to define the sidewalls 54 and 56 shown in FIG. 3 and an epitaxial growth process to establish the bridge layer 60 shown in FIG. 3. The stack 67 may consist of a layer 68 of silicon dioxide, silicon nitride or the like positioned on the substrate 12, and a layer 70 of silicon nitride, silicon dioxide or the like positioned on the layer 68. Alternatively, the stack 67 may consist of a single layer with sufficient thickness to withstand the etch process used to define the sidewalls 54 and 56 shown in FIG. 3. For example, the stack 67 may consist of a single layer of silicon dioxide. In an exemplary embodiment, the layer 68 is composed of silicon dioxide with a thickness of about 50 to 200 Å and may be formed by thermal oxidation or CVD. The layer 70 is advantageously composed of silicon nitride with a thickness of about 500 to 1500 Å and may be formed by low pressure CVD, plasma enhanced CVD or the like. If composed of silicon dioxide, the layer 68 will also serve to lessen the edge force transmitted to the substrate 12 by the silicon nitride layer 70. As used herein, the phrase "composed of" is not intended to exclude the incorporation of other constituents in a given layer.

Following establishment of the protective stack 67, the trench 58 is formed in the substrate 12 by anisotropic etching. The layer is masked with photoresist (not shown) that is patterned and developed. The etch is then performed using reactive ion etching, chemical plasma etching or the like, with successive chemistries that will attack silicon nitride, silicon dioxide and silicon, such as, for example, $CF_4/H_2$ for the silicon nitride and the silicon dioxide, and $H_2/Cl_2/SiCl_4$ for the silicon substrate 12. The photoresist is then removed by ashing. The trench 58 may have relatively vertical sidewalls as shown or tapered sidewalls as desired. Tapered sidewalls may be established by progressively reducing the anisotropic character of the etch chemistry over time by, for example, introducing one of the many well known carbonaceous polymers used to directionally etch silicon. The depth of the trench 58 may be about 0.015 to 0.040 $\mu$m as measured from the upper surface 72 of the substrate 12. The lateral dimension of the trench 58 may be the minimum feature size possible using the currently available lithographic patterning technology, or some dimension smaller than or larger than the available minimum feature size.

Figure 5:
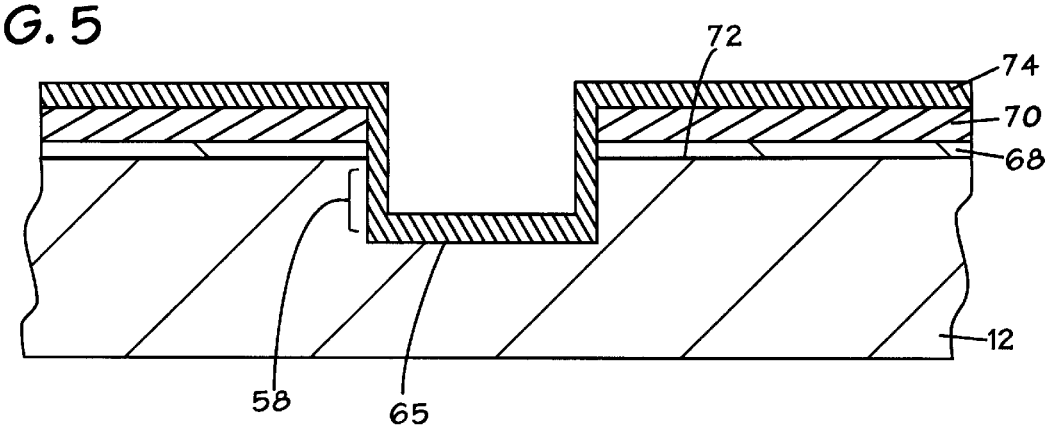
FIG. 5 is a cross sectional view like FIG. 4 depicting formation of an insulating layer in the trench in accordance with the present invention.
Figure 6:
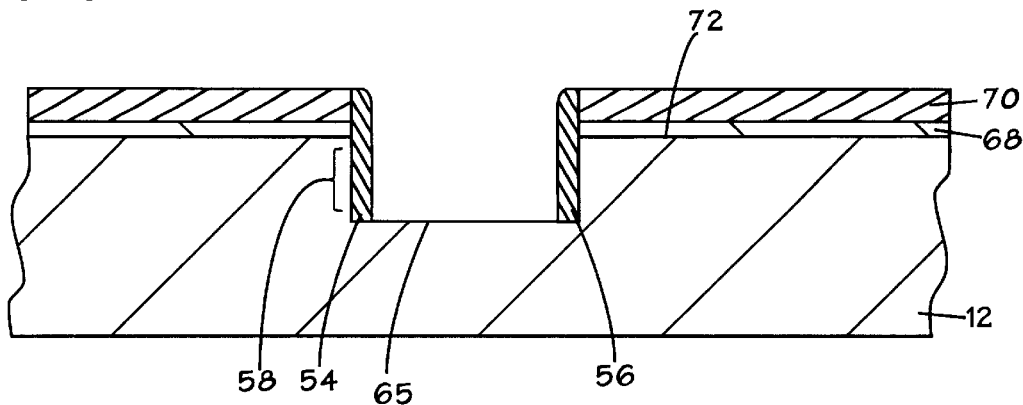
FIG. 6 is a cross sectional view like FIG. 5 depicting etch definition of insulating sidewalls in the trench in accordance with the present invention.
Figure 7:
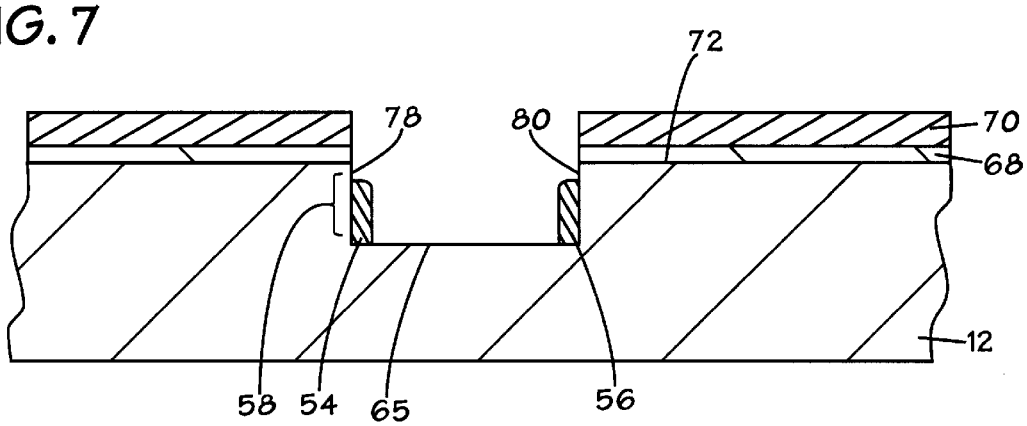
FIG. 7 is a cross sectional view like FIG. 6 depicting overetch of the sidewalls in accordance with the present invention.

The fabrication of the sidewalls 54 and 56 depicted in FIG. 3 may be understood by referring now to FIGS. 5, 6 and 7. Initially, an insulating layer 74 composed of silicon dioxide, silicon nitride or the like is blanket deposited over the layer 70 and into the trench 58. Any carbonaceous polymer used in the trench etch should be cleaned prior to the deposition using an appropriate solvent. In an exemplary embodiment, the insulating layer 74 is composed of silicon dioxide deposited via CVD to a thickness of about 50 to 500 Å. As shown in FIG. 6, the insulating layer 74 is anisotropically etched to yield the insulating sidewalls 54 and 56. The etch may be by reactive ion etching, chemical plasma etching or the like using a chemistry that is selective to the underlying silicon nitride layer 70, such as $SF_6$. The etch removes the portion of the insulating layer 74 shown in FIG. 5 that is positioned on the bottom 65 of the trench 58. Referring now to FIG. 7, the insulating sidewalls 54 and 56 are then overetched to expose opposing surfaces 78 and 80 of the trench 58. The opposing surfaces 78 and 80 will provide the starting points for the epitaxial growth of the bridge layer 60 shown in FIG. 3. The silicon nitride layer 70 protects the underlying silicon dioxide layer 68 and the substrate 12 from attack during the primary etch and the overetch.

Figure 8:
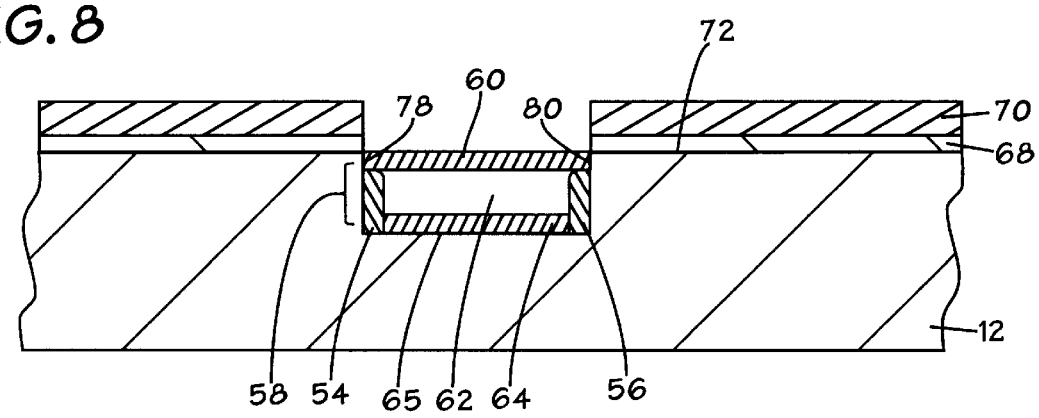
FIG. 8 is a cross sectional view like FIG. 7 depicting formation of a bridge layer in the trench in accordance with the present invention.

The fabrication of the bridge layer 60 may be understood by referring now to FIG. 8. The bridge layer 60 is established by epitaxial growth of silicon. The reactant species may be $SiH_4$, $SiHCl_3$, $SiH_2Cl_2$, or the like. The temperature and time parameters for the epitaxial growth process are largely a matter of design discretion. In an exemplary embodiment, $SiH_4$ is exposed in vapor phase at about 800 to 1050° C. The duration of the epi step will depend on the amount of silicon deposited. For example, where the substrate 12 is an unitary structure or part of a single wafer, the epi growth step is performed for about 1 to 3 minutes. If the substrate 12 is part of a wafer in a batch of wafers, the duration may be about 10 to 30 minutes. Although it is anticipated that the bridge layer 60 will quickly close over during the epi process, a thin epitaxial layer of silicon, designated earlier as the bottom layer 64 in FIG. 3, will form on the bottom 65 of the trench 58.

The formation of the bridge layer 60 encloses and, in concert with the sidewalls 54 and 56 and the substrate 12, defines the air gap 62. A small volume of any gas or gases present in the epi process ambient will normally be captured in the air gap 62 after the bridge layer 60 closes over. A particular ambient may be captured in the air gap 62 if desired by introducing the selected ambient into the epi tool prior to closure of the bridge layer 60. For example, nitrogen may be introduced into the epi tool to capture nitrogen in the air gap 60. Some nitrogen may be captured in the bridge layer 60 itself during epi formation. Additional nitrogen will diffuse from the air gap 62 into the bridge layer 60 during later high temperatures steps. A nitrogen doping of the bridge layer 60 will render the bridge layer 60 more resistant to the diffusion of dopants from the source/drain regions 36, 38, 48 and 50 during subsequent high temperature steps. Unrestricted diffusion of dopant atoms from the source/drain regions 36, 38, 48 and 50 could unintentionally convert the bridge layer 60 into a conducting pathway.

Regardless of the particular gas or gases present, the air gap 62 will have a dielectric constant $\kappa$ of about 1.0. The air gap 62 provides the isolation structure 26 with at least two desirable properties, one stemming from the low dielectric constant $\kappa$, the other stemming from the reduced bulk associated with the air gap 62. With a dielectric constant of about 1.0, the air gap 62 combined with the sidewalls 54 and 56 exhibits a lower combined effective dielectric constant than a comparably sized conventional trench isolation structure. The result is very low capacitance and correspondingly excellent electrical isolation for various devices on the substrate 12. Moreover, since the isolation structure 26 has less bulk, implants to establish the wells 39 and 52 (See FIG. 3) may be performed at lower energy ranges, such as those commonly used for punchthrough prevention implants. Accordingly, well formation and punchthrough prevention may be combined in a single implant.

Figure 9:
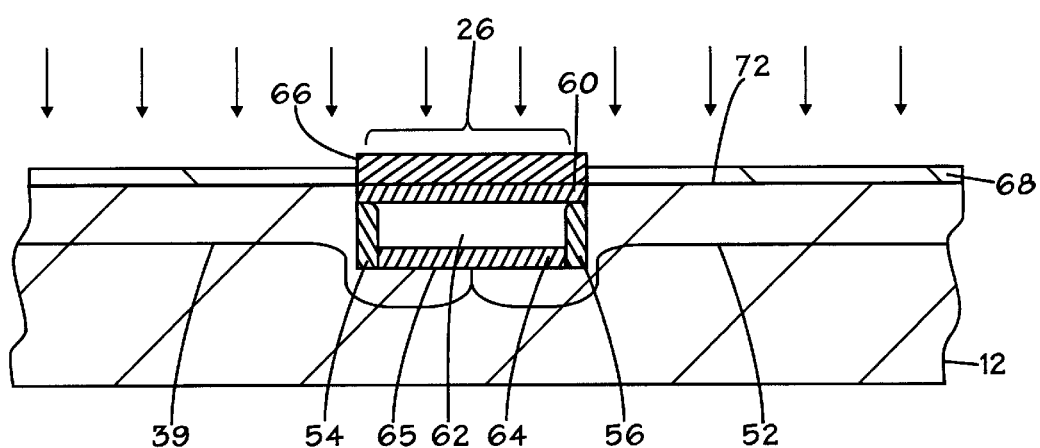
FIG. 9 is a cross sectional view like FIG. 8 depicting formation of an insulating layer on the bridge layer and establishment of twin wells in the substrate in accordance with the present invention.

The formation of the wells 39 and 52 may be understood by referring now to FIG. 9. The wells 39 and 52 are established by ion implantation. In order to prevent shorts between adjacent source/drain regions, such as the regions 38 and 48 shown in FIG. 3, the bridge layer 60 should be prevented from becoming conductive due to the absorption dopant atoms during the well, punchthrough prevention, threshold voltage control and source/drain implants. The bridge layer 60 is protected from dopant penetration during these later implants by the screen layer 66. The screen layer 66 may be formed by thermal oxidation of the upper surface of the bridge layer 60 or by CVD. The screen layer 66 should be thick enough to prevent a significant amount of dopant atoms from penetrating into the bridge layer 60. In an exemplary embodiment, the screen layer 66 may be about 1,000 to 2,000 Å thick. Following establishment of the screen layer 66, the silicon nitride layer 70 may be stripped by wet or dry etching. For example, a hot $H_3PO_4$ dip process or a dry etch using $CF_4/O_2$ may be used. The wells 39 and 52 are then established in the substrate 12 by ion implantation. Where the wells 39 and 52 are designed to be of the same conductivity type, e.g., p-type, the wells 39 and 52 may be established using a single implant at about 50 to 150 keV and a dosage of about 3E12 to 9E12 $cm^{-2}$. Alternatively, if the wells 39 and 52 are to be formed with opposite conductivity types, as the case will often be in CMOS processing, the well 39 may be implanted while the active area 24 is masked, and the process repeated by flip-flopping the masks and implanting the well 52. The same dosages may be applied for the wells 39 and 52 if they are of opposite conductivity type. However, the energies will be proportional to the masses of the dopant atoms.

The skilled artisan will appreciate that the screen layer 66 may be eliminated from the process flow if the various implants do not pose a risk of converting the bridge layer 60 into a conductive pathway. For example, if the source/drain regions 38 and 48 are established by introducing an n-type impurity, subsequent p-type implants should not convert the bridge layer 60 into a conductor that shorts the source/drain regions 38 and 48.

The range of the dopant atoms through the isolation structure 26 is much greater than the range would be through conventional trench isolation material. Accordingly, the well implants may be performed with much lower energy than is required in conventional fabrication processing. Thus, the wells 39 and 52 have relatively shallow junction depths in the active areas 22 and 24 as shown in FIGS. 3 and 9. With such shallow positioning, the well implant may also serve as the punch through prevention implant, thus eliminating a separate implant step for punchthrough prevention. A threshold voltage control implant may be performed at about 2 to 20 keV and a dosage of about 2E12 to 8E12 $cm^{-2}$.

Referring again to FIG. 3, the transistors 18 and 20 may be fabricated. The gate dielectric layers 27 and 40 are advantageously formed by growing or depositing a layer of insulating material on the substrate 12. The layer will be subsequently masked and etched to define the layers 27 and 40. Exemplary materials include $SiO_2$, $TiO_2$, $Ta_2O_5$, $CrO_2$, $SrO_2$ or like materials. The layer may be grown by thermal oxidation or deposited by low pressure CVD, metal organic CVD, jet vapor deposition, sputter deposition or like techniques. In an exemplary embodiment, the layers 27 and 40 consist of $SiO_2$ formed by thermal oxidation of the substrate 12 at about 700 to 900° C. for about 10 to 30 seconds in a rapid thermal anneal ("RTA"). The layers 27 and 40 may have a thickness of about 10 to 50 Å.

The gate electrodes 28 and 42 are fabricated by initially depositing a layer of conducting material on the gate dielectric layers 27 and 40. The electrodes 28 and 42 may be composed of a variety of conducting materials, such as, for example, polysilicon, amorphous silicon, aluminum, tantalum or the like. In an exemplary embodiment, the electrodes 28 and 42 are composed of polysilicon. Well known techniques for applying polysilicon, such as CVD, may be used. In an exemplary embodiment, the polysilicon is deposited in situ after the layers 27 and 40 at or above about 625° C. to a thickness of about 750 to 1800 Å, and advantageously to about 1300 Å. The $SiO_2$ and polysilicon layers are then anisotropically etched to yield the defined gate dielectrics 27 and 40 and electrodes 28 and 42. Later implants for the source/drain regions 36, 38, 48 and 50 will render the electrodes 28 and 42 conductive.

The spacers 32, 34, 44 and 46 are fabricated by blanket depositing a layer of dielectric material and anisotropically etching the layer to define the spacers 32, 34, 44 and 46. The conformal dielectric layer may be composed of a variety of materials commonly used for dielectric spacers, such as silicon nitride, silicon dioxide, silicon oxynitride, or the like. In an exemplary embodiment, the layer 20 is composed of silicon nitride deposited by low pressure or plasma CVD to a thickness of about 20 to 100 Å and advantageously to about 60 Å. The etch may be by reactive ion etching, chemical plasma etching, or other suitable anisotropic etching techniques utilizing a chemistry suitable for anisotropically etching silicon nitride, such as $CF_4/O_2$.

The source/drain regions 36, 38, 48 and 50 may be formed by ion implantation or diffusion as desired, and may be single-graded or incorporate lightly doped drain ("LDD") structures. In an exemplary embodiment, the source/drain regions 36, 38, 48 and 50 are single-graded. If implemented as CMOS, the source/drain regions 36 and 38 may be established by implanting a n-type dopant, such as arsenic at a dosage of about 1E15 to 1E16 $cm^{-2}$ and an energy of about 10 to 30 keV, while the source/drain regions 48 and 50 may be implanted with dopant of opposite conductivity type, such as boron, with the same dosage and an energy of about 5 to 15 keV. The implants may be on or off-axis.

Activation of the source/drain regions 36, 38, 48 and 50 may be by subsequent high temperature steps for interlevel dielectric formation. If desired, a separate anneal step may be performed at about 700 to 850° C. for about 5 to 15 seconds in a RTA or about 5 to 15 minutes in a furnace process.

The skilled artisan will appreciate that the process of the present invention yields an isolation structure that provides excellent electrical isolation and enables tighter packing density. The incorporation of the low dielectric constant air gap 62 (See FIG. 3) into the structure 26 yields a very low capacitance. The lower capacitance reduces the potential for sidewall inversion, particularly in CMOS wells. Furthermore, the reduction in capacitance is achieved without the need for increasing the lateral dimension of the structure 26. Thus, the lateral dimension of the structure 26 may be scaled to the minimum feature size of the prevailing lithographic patterning technology or smaller without loss of isolation function. Moreover, as the fabrication does not require planarization of a trench dielectric to a substrate surface, the potential for parasitic conduction due to silicon sidewall exposure is eliminated, and processing is simplified through the elimination of an etchback or CMP process.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An isolation structure positioned in a trench in a substrate having an upper surface, comprising:

a first insulating sidewall;

a second insulating sidewall positioned in spaced-apart relation to the first insulating sidewall;

a semiconductor layer positioned in the trench and bridging the first and second insulating sidewalls, the semiconductor layer, the first and second insulating sidewalls and the substrate defining an air gap in the trench; and an insulating layer positioned on the semiconductor layer.

2. The isolation structure of claim 1, wherein the insulating layer comprises silicon dioxide.

3. The isolation structure of claim 1, wherein the first and second insulating sidewalls comprise silicon dioxide.

4. The isolation structure of claim 1, wherein the air gap contains a gas.

5. The isolation structure of claim 1, wherein the gas comprises nitrogen.

6. The isolation structure of claim 1, wherein the substrate has an upper surface and the semiconductor layer is positioned below the upper surface.

7. An integrated circuit, comprising:
   a substrate having a trench;
   a first circuit device positioned on the substrate;
   a second circuit device positioned on the substrate; and
   an isolation structure positioned in the trench and separating the first and second circuit devices, the isolation structure having a first insulating sidewall, a second insulating sidewall positioned in spaced-apart relation to the first insulating sidewall, a semiconductor layer positioned in the trench and bridging the first and second insulating sidewalls, the semiconductor layer, the first and second insulating sidewalls and the substrate defining an air gap in the trench, and an insulating layer positioned on the semiconductor layer.

8. The integrated circuit of claim 7, wherein the first and second circuit devices comprise transistors.

9. The integrated circuit of claim 8, wherein the first and second circuit devices comprise field effect transistors.

10. The integrated circuit of claim 7, wherein the insulating layer comprises silicon dioxide.

11. The integrated circuit of claim 7, wherein the first and second insulating sidewalls comprise silicon dioxide.

12. The integrated circuit of claim 7, wherein the air gap contains a gas.

13. The integrated circuit of claim 7, wherein the gas comprises nitrogen.

14. The integrated circuit of claim 7, wherein the substrate has an upper surface and the semiconductor layer is positioned below the upper surface.

15. The isolation structure of claim 1, wherein the semiconductor layer comprises silicon.

16. The integrated circuit of claim 7, wherein the semiconductor layer comprises silicon.

17. An isolation structure positioned in a trench in a substrate, comprising:
   a first insulating sidewall;
   a second insulating sidewall positioned in spaced-apart relation to the first insulating sidewall;
   a layer positioned in the trench and bridging the first and second insulating sidewalls, the layer, the first and second insulating sidewalls and the substrate defining an air gap in the trench containing a gas; and
   an insulating layer positioned on the layer.

18. The isolation structure of claim 17, wherein the gas comprises nitrogen.

19. The isolation structure of claim 17, wherein the insulating layer comprises silicon dioxide.

20. The isolation structure of claim 17, wherein the first and second insulating sidewalls comprises silicon dioxide.

21. The isolation structure of claim 17, wherein the substrate has an upper surface and the layer is positioned below the upper surface.

* * * * *